(12) United States Patent
Kishita (10) Patent No.: US 11,137,678 B2
(45) Date of Patent: Oct. 5, 2021

(54) METHOD OF EVALUATING PHOTOMASK BLANK-ASSOCIATED SUBSTRATE

(71) Applicant: SHIN-ETSU CHEMICAL CO., LTD., Tokyo (JP)

(72) Inventor: Takahiro Kishita, Joetsu (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 226 days.

(21) Appl. No.: 16/419,130

(22) Filed: May 22, 2019

(65) Prior Publication Data

US 2019/0384166 A1  Dec. 19, 2019

(30) Foreign Application Priority Data

Jun. 19, 2018  (JP) .............................. JP2018-116305

(51) Int. Cl.
*G03F 1/84* (2012.01)
*G03F 1/50* (2012.01)

(52) U.S. Cl.
CPC . *G03F 1/84* (2013.01); *G03F 1/50* (2013.01)

(58) Field of Classification Search
CPC ..................................... G03F 1/84; G03F 1/50
See application file for complete search history.

(56) References Cited

U.S. PATENT DOCUMENTS

| | | | |
|---|---|---|---|
| 2002/0115003 A1 | 8/2002 | Tsukamoto et al. | |
| 2016/0116837 A1* | 4/2016 | Terasawa | G03F 1/84 430/5 |
| 2016/0377553 A1* | 12/2016 | Terasawa | G03F 1/36 430/5 |
| 2018/0209916 A1* | 7/2018 | Terasawa | G01N 21/956 |

FOREIGN PATENT DOCUMENTS

| | | |
|---|---|---|
| JP | 2002-196475 A | 7/2002 |
| JP | 2016-085211 A | 5/2016 |

OTHER PUBLICATIONS

Jun. 15, 2021 Office Action issued in Japanese Patent Application No. 2018-116305.

* cited by examiner

*Primary Examiner* — Stewart A Fraser
(74) *Attorney, Agent, or Firm* — Oliff PLC (57) ABSTRACT

The present invention is a method of evaluating a photomask blank-associated substrate, including the steps of: taking an image of a surface of the photomask blank-associated substrate to acquire a surface image, acquiring a contrast of the surface image from the acquired surface image, and evaluating the photomask blank-associated substrate on the basis of the acquired contrast of the surface image. This provides a method of evaluating a photomask blank-associated substrate that can conveniently evaluate the surface conditions (e.g., film qualities other than the transparency or the optical constants of an optical film and so on formed on a transparent substrate) of a photomask blank-associated substrate.

16 Claims, 5 Drawing Sheets

METHOD OF EVALUATING PHOTOMASK BLANK-ASSOCIATED SUBSTRATE

TECHNICAL FIELD

The present invention relates to a method of evaluating a photomask blank, a photomask blank-intermediate product, or a glass substrate for a photomask blank (hereinafter, they are also referred to as a photomask blank-associated substrate) for manufacturing photomasks (transfer masks) used for producing semiconductor devices and so on.

BACKGROUND ART

Semiconductor devices are manufactured using photolithography techniques of irradiating a pattern transfer mask, such as a photomask with a circuit pattern drawn thereon, with an exposure light and transferring the circuit pattern formed in the mask to a semiconductor substrate via a demagnification optical system. Due to miniaturization of circuit patterns of semiconductor devices, the exposure light with a wavelength of 193 nm has been the mainstream using fluorinated argon (ArF) excimer laser. By using a process of multi patterning, in which a plurality of exposure processes and processing processes are combined, a pattern can be formed in a size that is adequately smaller compared to the exposure wavelength.

A mask for transferring a pattern is manufactured by forming a circuit pattern to a photomask blank in which an optical film is formed on a transparent substrate (a glass substrate for a photomask). Such an optical film is generally a film containing chromium or a film containing molybdenum and functions as a light-shielding film or a phase shift film (see Patent Document 1), which may be used as a photomask blank and may also be used as a photomask blank after forming a hard mask film or an etching stop film for high-accuracy processing of an optical film.

The photomask blank and the glass substrate for a photomask have been required to have more flat surfaces for further miniaturization.

To manufacture a photomask blank by film deposition on a glass substrate for a photomask, the process is necessitated to laminate each optical film successively as described above, and the intermediate products (photomask blank-intermediate products) are also required to be flat.

CITATION LIST

Patent Literature

Patent Document 1: Japanese Unexamined Patent Publication (Kokai) No. 2002-196475

SUMMARY OF INVENTION

Technical Problem

In manufacturing processes of photomask blanks, for example, a sputtering method is used for film deposition. The optical films can have different film qualities even though the film thickness and the optical constants are the same (even when the same kind of films were produced with a prescribed value of each optical property and film thickness, the film conditions can vary due to a trouble in the manufacturing process). Accordingly, it has been required to have a tool for controlling the film quality conveniently other than the film thickness or the optical constants.

The difference of film quality (change of the film quality) can cause change in processability to fail to have a desired pattern profile.

As a tool for controlling the film quality, for example, surface roughness is plausible. In this case, the roughness is measured using an atomic force microscope (AFM) generally because the photomask blank comes to have an arithmetic mean of roughness (Ra) of 0.5 nm or less due to the progress of flattening. However, the measurement with AFM is a destructive inspection and cannot measure a photomask blank-associated substrate in itself used for producing a photomask.

Due to the progress of miniaturization, photomask blank-associated substrates have to be inspected for defects such as foreign matters and pinholes in more minute sizes. Accordingly, the tester have to be improved in sensitivity. In this inspection, however, a minute defect is sought to detect, thereby causing pseudo defect, which is a non-defective part determined as a defect in the inspection, to cause a problem that a tester is occupied for a long time to detect many pseudo defects.

The reason for recognition of pseudo defect is rugged surface roughness, for example, making it difficult to distinguish between the height and the height of a defect.

The present invention is accomplished in view of the above issues, and it is an object of the present invention to provide a method of evaluating a photomask blank-associated substrate that can conveniently evaluate the surface conditions (film qualities other than the transparency or the optical constants of an optical film and so on formed on a transparent substrate) of a photomask blank-associated substrate.

Solution to Problem

To achieve the above objects, the present invention provides a method of evaluating a photomask blank-associated substrate, comprising the steps of:

taking an image of a surface of the photomask blank-associated substrate to acquire a surface image, acquiring a contrast of the surface image from the acquired surface image, and evaluating the photomask blank-associated substrate on the basis of the acquired contrast of the surface image.

Incidentally, the contrast of a surface image herein means the difference between the brightest part and the darkest part of an image obtained in a prescribed area of a photomask blank-associated substrate in an image obtained by reflection of light applied to the surface of the photomask blank-associated substrate. That is, the contrast $\Delta$ is defined as follows letting the intensities of reflection light be Imax and Imin respectively at the brightest part and the darkest part of the image.

$$\Delta = (I\max - I\min)/(I\max + I\min)$$

The present inventor has diligently investigated to find that the contrast $\Delta$ is correlated with the profile of surface roughness of a photomask blank-associated substrate, and the measured contrast $\Delta$ can be an indicator of surface conditions of a mask blank that reflects surface roughness and waviness (the conditions of film surface when a film is formed on the surface, hereinafter, also referred to as film qualities). The present invention is a method of evaluating a photomask blank-associated substrate with such a new indicator, making it possible to evaluate film qualities other than transparency or optical constants conveniently in a non-defective mode.

This evaluation method can be performed before inspecting defects, for example, to previously eliminate a photomask blank-associated substrate having many pseudo defects. This makes it possible to prevent a defect tester from being occupied for a long time due to many pseudo defects as in the past. Accordingly, the defect inspection is brought to be more efficient.

Additionally, the inventive evaluation method consequently makes it possible to eliminate a product with abnormal film qualities to provide a high-quality photomask blank-associated substrate stably.

The evaluation of the photomask blank-associated substrate can comprise the steps of:
  acquiring a standard contrast previously, comprising:
  preparing a standard photomask blank-associated substrate, and acquiring a contrast of a surface image of the standard photomask blank-associated substrate as the standard contrast;
  acquiring an evaluation-target contrast, comprising:
  preparing an evaluation-target photomask blank-associated substrate other than the standard photomask blank-associated substrate, and acquiring a contrast of a surface image of the evaluation-target photomask blank-associated substrate as the evaluation-target contrast using an optical system identical with that used in the step of acquiring the standard contrast; and comparing contrasts to evaluate the evaluation-target photomask blank-associated substrate by comparing the evaluation-target contrast and the standard contrast.

With a photomask blank-associated substrate to be the standard, which is prepared to be compared as a standard sample as described above, the film quality can be evaluated more precisely.

It is also possible to evaluate the evaluation-target photomask blank-associated substrate as a non-defective when the evaluation-target contrast is within a range of a predetermined percentage relative to the standard contrast in the step of comparing contrasts.

In particular, it is possible to evaluate the evaluation-target photomask blank-associated substrate as a non-defective when the evaluation-target contrast is within a range of ±10% relative to the standard contrast in the step of comparing contrasts.

These make it possible to distinguish between normal ones and abnormal ones in film qualities to determine a non-defective from evaluation targets more securely. Accordingly, it is possible to provide photomask blank-associated substrates that are stable in quality.

The present invention also provides a method of evaluating a photomask blank-associated substrate, comprising the steps of:
  taking an image of a surface of the photomask blank-associated substrate to acquire a surface image, acquiring a contrast of the surface image from the acquired surface image, calculating a contrast amplification factor to set the acquired contrast of the surface image to a predetermined value, and evaluating the photomask blank-associated substrate on the basis of the calculated contrast amplification factor.

Incidentally, the contrast amplification factor ($\gamma$) of a surface image herein means an amplification factor (magnification) to set a contrast to prescribed magnitude. That is, the contrast amplification factor $\gamma$ is defined as follows letting the prescribed contrast be $\alpha$.

$$\gamma = \alpha/\Delta$$

The inventive evaluation method described above makes it possible to evaluate film qualities other than transparency or optical constants conveniently in a non-defective mode.

This evaluation method can be performed before inspecting defects to previously eliminate a photomask blank-associated substrate having many pseudo defects. Additionally, it is also possible to eliminate a product with abnormal surface conditions to contribute to manufacture high-quality photomask blank-associated substrates.

The evaluation of the photomask blank-associated substrate can comprise the steps of:
  calculating a standard contrast amplification factor previously, comprising:
  preparing a standard photomask blank-associated substrate, and
  calculating a contrast amplification factor of a contrast of a surface image of the standard photomask blank-associated substrate as the standard contrast amplification factor;
  calculating an evaluation-target contrast amplification factor, comprising:
  preparing an evaluation-target photomask blank-associated substrate other than the standard photomask blank-associated substrate, and
  calculating a contrast amplification factor of a contrast of a surface image of the evaluation-target photomask blank-associated substrate as the evaluation-target contrast amplification factor using an optical system identical with that used in the step of calculating the standard contrast amplification factor; and
  comparing contrast amplification factors to evaluate the evaluation-target photomask blank-associated substrate by comparing the evaluation-target contrast amplification factor and the standard contrast amplification factor.

With a photomask blank-associated substrate to be the standard, which is prepared to be compared as a standard sample as described above, the film quality can be evaluated more precisely.

It is also possible to evaluate the evaluation-target photomask blank-associated substrate as a non-defective when the evaluation-target contrast amplification factor is within a range of a predetermined percentage relative to the standard contrast amplification factor in the step of comparing contrast amplification factors.

In particular, it is possible to evaluate the evaluation-target photomask blank-associated substrate as a non-defective when the evaluation-target contrast amplification factor is within a range of ±10% relative to the standard contrast amplification factor in the step of comparing contrast amplification factors.

These make it possible to distinguish between normal ones and abnormal ones in film qualities and glass substrates for photomasks to determine a non-defective from evaluation targets more securely. Accordingly, it is possible to provide photomask blank-associated substrates that are stable in quality.

The image of the surface of the photomask blank-associated substrate can be taken under a confocal optical system and a bright-field in acquiring the surface image.

As the optical system, the use of a confocal optical system is preferable because the variation of contrast is emphasized in accordance with the variation in the direction of height. In particular, a confocal optical system using laser beam tends to emphasize a gap in height as a difference of reflection intensity.

Under a bright field, it is possible to secure contrast even when the surface is hardly uneven.

Advantageous Effects of Invention

As described above, the present invention makes it possible to evaluate a photomask blank-associated substrate based on surface conditions, which are properties other than transparency or optical constants, conveniently in a non-defective mode. Additionally, it is also possible to prevent a defect tester from being occupied for a long time due to the presence of many pseudo defects, and to contribute to stable manufacturing of high-quality products with good surface conditions.

DESCRIPTION OF EMBODIMENTS

Hereinafter, the embodiments of the present invention will be described more specifically by referring FIGS, but the present invention is not limited thereto.

The First Embodiment

In the first place, the present invention will be described in case of using a contrast as an indicator to evaluate the surface conditions of a photomask blank-associated substrate.

The inventive evaluation method is only necessitated to include steps of taking an image of a surface of the photomask blank-associated substrate to acquire a surface image, acquiring a contrast of the surface image from the acquired surface image, and evaluating the photomask blank-associated substrate on the basis of the acquired contrast of the surface image. The contrast is acquired using the formula described above.

Incidentally, the evaluation may be conducted by performing the above steps on only a photomask blank-associated substrate of an evaluation target. It is also possible to conduct the evaluation by performing the above steps on a photomask blank-associated substrate to be a standard, together with the photomask blank-associated substrate of an evaluation target, and comparing the obtained contrasts as described below. With the standard photomask blank-associated substrate, which is prepared to be compared as a standard sample, the surface conditions such as film quality can be evaluated more precisely.

Hereinafter, more specific process procedures will be described.

<Step of Acquiring Standard Contrast>

In the first place, a standard photomask blank-associated substrate is prepared. In case of a transparent substrate (a glass substrate for photomask), an intermediate product of photomask blank, and a photomask blank, it is also possible to prepare a substrate in which the optical film formed thereon is made from the same material as that of a photomask blank-associated substrate of an evaluation target.

Incidentally, the photomask blank-associated substrate to be an evaluation target may be a transparent substrate (a glass substrate for photomask), photomask blanks having any of a Cr-containing film, an MoSi-containing film, and so on formed thereon, which are generally used for a photomask, and intermediate products of photomask blanks, which are intermediate products to laminate each optical film successively. In case of photomask blanks and intermediate products of photomask blanks, the composition of the film, the film thickness, and so on are not particularly limited. The film of photomask blank may be composed by forming an MoSi-containing half-tone film, additionally forming a Cr-containing film thereon as a light-shielding film, still additionally forming an Si-containing hard mask thereon; forming a Cr-containing film, an MoSi-containing light-shielding film, and a C-containing film formed on an MoSi-containing half-tone film in this order; forming a Cr-containing film, additionally forming an Si-containing film thereon, and still additionally forming a Cr-containing film thereon. The film deposition method is not particularly limited, and sputtering method is applied, for example.

Then, the surface image is acquired by taking an image of the surface of the prepared standard photomask blank-associated substrate. In this step, any apparatus may be used if it can take an image so as to acquire a contrast from the acquired surface image later, for example, a defect tester that can acquire a surface image can be used.

In this case, the use of a confocal optical system makes it possible to emphasize the variation of contrast relative to the variation in the direction of height. The use of a bright field is preferable because the contrast can be securely obtained even if the surface to be taken an image is hardly uneven. It is particularly preferable to take an image under a confocal optical system and a bright-field.

Incidentally, the area to be taken an image is preferably a part without having defects such as a foreign matter, a hollow, and a pinhole on the surface.

In taking an image, it is preferable to use an wavelength of 600 nm or less. The lower limit is, for example, 150 nm or more though it is not particularly limited thereto. Shorter wavelength is preferable because of the sensitivity to defects and the capability to reflect minute unevenness. Particularly, in half pitch generation with a size of finer than 10 nm, 400 nm or less is preferable.

Then, from the acquired surface image, the contrast of the surface image is acquired. This is set to a standard contrast.

Incidentally, the surface image may be processed with an algorithm for image processing, such as differential processing, and an image in which the surface condition is more emphasized may be used.

<Step of Acquiring Evaluation-target Contrast>

Subsequently, a photomask blank-associated substrate is prepared to be actually evaluated other than the standard photomask blank-associated substrate. This is processed in the same way as in the step of acquiring the standard contrast using the identical optical system to acquire the surface image and the contrast of the surface image, which is used as a evaluation-target contrast.

<Step of Comparing Contrasts>

Then, the acquired evaluation-target contrast is compared with the standard contrast to evaluate the photomask blank-associated substrate to be an evaluation target.

The criterion in this comparison for evaluation is not particularly limited and can be set to within a range of ±10% relative to the standard contrast. That is, the evaluation-target photomask blank-associated substrate may be evaluated such that when the evaluation-target contrast is within a range of ±10% relative to the standard contrast, the substrate is determined as a non-defective. Using such a criterion, it is possible to securely distinguish abnormal ones from normal ones for the film quality or the glass substrate for photomask to perform non-defective determination of evaluation targets with higher precision. This makes it possible to stabilize the quality.

Incidentally, the criterion is not limited to within a range of ±10%, and can be set to within a range of a predetermined percentage relative to the standard contrast in accordance with the desired criterion for evaluation.

The inventive evaluation method described above makes it possible to evaluate the surface conditions of a photomask blank-associated substrate conveniently in a non-defective mode, not as in the previous destructive inspections using AFM, for example. Additionally, this can be conducted before inspecting defects to prevent elongation of time for inspecting defects due to pseudo-defects to improve the efficiency. It is also possible to eliminate the ones having abnormal surface conditions to provide high-quality photomask blank-associated substrate.

The present invention can be used for detecting a mistake or abnormality in a process other than evaluating and inspecting a product. For example, this can be used for monitoring steps in a film deposition process or may be used for monitoring the change of surface roughness or waviness in a glass substrate for a photomask in accordance with the change of polishing conditions.

In the inventive evaluation method conducted before inspecting defects as described above, the inspection for defects liable to determine a nonexistent defect as a defect when the evaluation-target contrast is a prescribed value or more. In such a case, it is recommended to determine the inspection result as inappropriate or to interrupt the inspection.

In case of having a step of inspecting defects as the next step, the present invention can be performed in the following procedure, for example.

Figure 1:
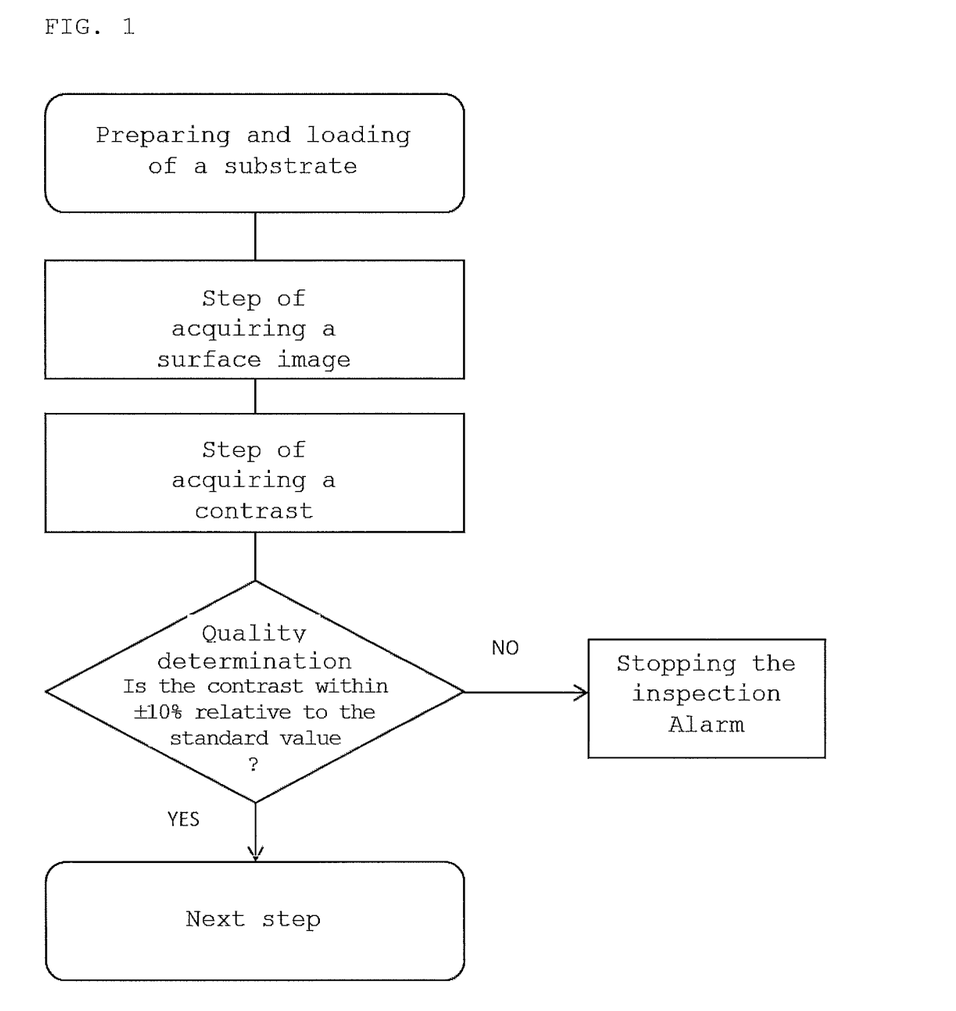
FIG. 1 is an example of a flowchart of the inventive evaluation using contrast in manufacturing a photomask blank-associated substrate.

FIG. 1 is an example of a process flowchart of the inventive evaluation using contrast in manufacturing a photomask blank-associated substrate.

As the apparatus for evaluation, it is possible to use a defect tester that can acquire a surface image.

In the first place, a program is constructed so as to automatize a series of steps of acquiring a surface image, acquiring a contrast, and quality determination (comparing contrasts).

Subsequently, a standard substrate (standard photomask blank-associated substrate) is prepared, and the surface image is acquired to calculate a standard contrast $\Delta_{STD}$. In this step, the $\Delta_{STD}$ is calculated from the average of total five points of the four corner parts and the central parts, for example.

Lastly, a threshold is set in a tester to recognize the evaluation target normal when the contrast is within a range of $\Delta_{STD}\pm10\%$.

After finishing the setting described above, a photomask blank-associated substrate of an evaluation target (evaluation-target photomask blank-associated substrate) is inspected. In the step of acquiring an image, the surface image is acquired in coordinates previously designated. In the step of acquiring a contrast, the acquired image is automatically measured for the contrast. In the step of quality determination, the contrast of the sample is compared with the previously set standard value, and only when it is within a range of ±10%, the subsequent step is conducted. At this time, regarding the photomask blank-associated substrate recognized as abnormal, the inspection is configured to stop to sound alarm.

This inspection procedure makes it possible to promptly detect abnormality of the film surface, the quality determination of which has been difficult previously, to improve the process promptly.

The Second Embodiment

Subsequently, the evaluation of the surface condition of a photomask blank-associated substrate will be described in case of using a contrast amplification factor as an indicator.

The inventive evaluation method is only necessitated to include steps of taking an image of the surface of a photomask blank-associated substrate to acquire a surface image, acquiring a contrast of the surface image from the acquired surface image, calculating a contrast amplification factor to set the acquired contrast of the surface image to a predetermined value, and evaluating the photomask blank-associated substrate on the basis of the calculated contrast amplification factor. The contrast amplification factor is calculated using the formula described above.

That is, this is an embodiment of evaluation which differs from the first embodiment in calculating a contrast amplification factor after acquiring the constant and using the contrast amplification factor instead of the contrast.

More specifically, the step of calculating a standard contrast amplification factor is conducted previously in the first place, for example, by preparing a standard photomask blank-associated substrate and calculating the contrast amplification factor of a contrast of the surface image thereof as the standard contrast amplification factor.

Subsequently, the step of calculating a evaluation-target contrast amplification factor is conducted by preparing a evaluation-target photomask blank-associated substrate and calculating a contrast amplification factor of a contrast of a surface image of the evaluation-target photomask blank-associated substrate as the evaluation-target contrast amplification factor using an optical system identical with that used in the step of calculating the standard contrast amplification factor.

Then, the step of comparing contrast amplification factors is conducted by comparing the evaluation-target contrast amplification factor and the standard contrast amplification factor to evaluate the evaluation-target photomask blank-associated substrate.

This procedure also makes it possible to evaluate a photomask blank-associated substrate conveniently in a non-defective mode and to achieve the various effects described above as in the first embodiment.

Incidentally, other elements (such as the conditions of a confocal optical system and a bright-field; the criterion in the step of comparing contrast amplification factors: within a range of a predetermined percentage, particularly within a range of ±10% relative to the standard contrast amplification factor; etc.) may be the same as in the first embodiment.

EXAMPLE

Hereinafter, the present invention will be described specifically by showing Examples and Comparative Examples, but the present invention is not limited thereto.

Example 1

The inventive evaluation method was performed on a phase shift mask by the evaluation method using a contrast.

In the first place, a phase shift film composed of molybdenum, silicon, oxygen, and nitrogen was deposited onto a quartz glass substrate in a square of side 6 inches (about 15 cm) by sputtering method using a molybdenum silicon target and a silicon target as the target, together with argon, nitrogen, and oxygen gases as the sputtering gas to prepare two pieces of standard substrates. On one of the standard substrates, the transparency and the reflectivity were measured using a spectrophotometer, and the surface roughness was measured using AFM. The other standard substrate was used as the standard substrate STD to set the standard contrast of the phase shift film (the standard photomask blank).

Subsequently, the surface images of the standard substrate STD were acquired using M6640S manufactured by Lasertec Corporation at the corner parts of S1 (−65 mm, −65 mm), S2 (−65 mm, 65 mm), S3 (65 mm, −65 mm), and S4 (65 mm, 65 mm) as well as the central part S5 (0 mm, 0 mm) wherein a defect of concave shape or convex shape was not observed. Hereinafter, the part wherein a defect of concave shape or convex shape is not observed using a prescribed tester is defined as a non-defective part, and this surface image is defined as a non-defective image.

Each contrast $\Delta_{S1}$ to $\Delta_{S5}$ was determined on the basis of each non-defective image of S1 to S5 (the standard contrast).

Figure 2A:
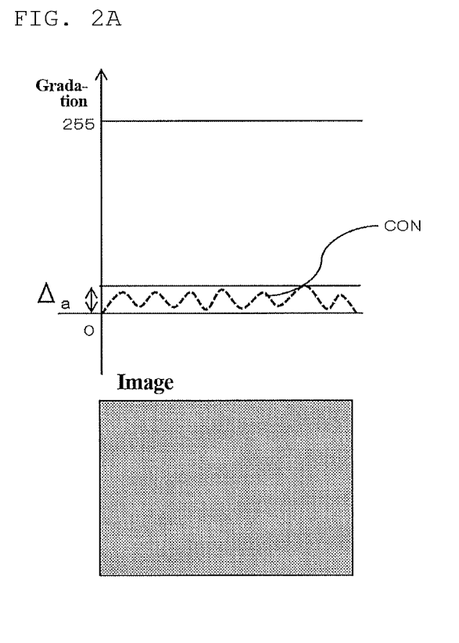
FIG. 2A is an explanatory drawing of an example showing relation between the contrast and the surface conditions of a photomask blank film, in which Δa is a contrast at the non-defective part.
Figure 2B:
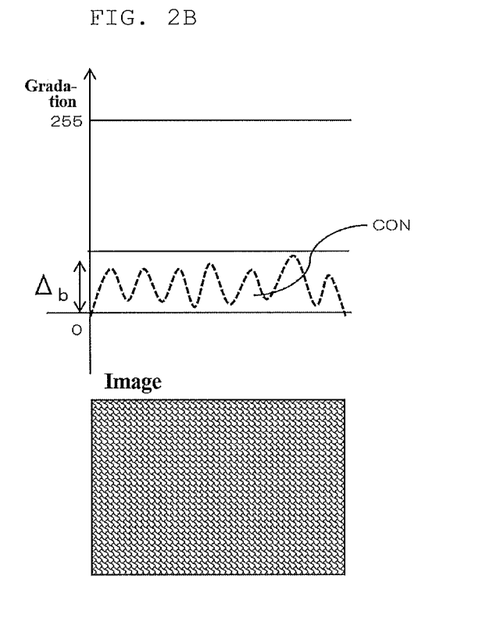
FIG. 2B is an explanatory drawing of an example showing relation between the contrast and the surface conditions of a photomask blank film, in which Δb is a contrast when the surface roughness is larger than the usual.

In the first place, the relation between the surface conditions and the contrast will be described by example. FIG. 2 show the relation between the contrast and the surface conditions of a photomask blank film. FIG. 2A shows the contrast $\Delta_a$ at the non-defective part. In case of a non-defective image, the contrast value depends on the contrast CON of the surface conditions of a film. FIG. 2B shows a case in which the surface roughness of a film is larger than the usual. When the surface roughness is larger than in the case of FIG. 2A, the contrast CON is emphasized even in a non-defective part, thereby making the contrast $\Delta b$ at the non-defective part larger than $\Delta_a$. In the other examples, it is considered that the contrast $\Delta b$ will be larger than $\Delta_a$ when the surface conditions are not normal such as large surface waviness and abnormality of film quality.

The following Table 1 shows the contrasts $\Delta_{S1}$ to $\Delta_{S5}$ of the standard substrate.

On the basis of these results, the average contrast was calculated such that $\Delta_{AVE}=11$. Incidentally, many number of acquired images can equalize the variation of contrast, but five or less images are preferable in view of the balance with efficiency in producing photomask blanks. In case of considering the plane uniformity of a photomask blank, it is preferable to acquire the images at the corner part(s) and the central part of a substrate.

TABLE 1

| Contrast | $\Delta_{S1}$ | $\Delta_{S2}$ | $\Delta_{S3}$ | $\Delta_{S4}$ | $\Delta_{S5}$ | $\Delta_{AVE}$ |
|---|---|---|---|---|---|---|
| STD | 11 | 12 | 11 | 12 | 11 | 11 |

Then, the evaluation targets were prepared such that LOTs (A) to (D) were prepared by depositing a film under the same deposition conditions as in the standard substrate, and Lot (E) was prepared by changing the deposition gas pressure and adjusting the flow rates of the nitrogen gas and the oxygen gas so as to have transparency, reflectivity, and a film thickness that were equivalent to those of LOTs (A) to (D) (evaluation-target photomask blank). Using M6640S, the surface images (non-defective images) were acquired at the corner parts of S1 to S4 and the central part S5 wherein a defect was not observed, and the contrasts $\Delta_{S1}$ to $\Delta_{S5}$ were determined on the basis of the images (evaluation-target contrasts).

The following Table 2 shows the contrasts $\Delta_{S1}$ to $\Delta_{S1}$ and the average contrast $\Delta_{AVE}$.

In LOTs (A) to (E), the variations were within 5% regarding the transparency, the reflectivity, and the film thickness.

The $\Delta_{AVE}$ in each of LOTs (A) to (D) was varied within ±10% relative to the standard substrate, but the $\Delta_{AVE}$ of LOT (E) was larger than that of the standard substrate STD by 20% or more.

TABLE 2

| Contrast | $\Delta_{S1}$ | $\Delta_{S2}$ | $\Delta_{S3}$ | $\Delta_{S4}$ | $\Delta_{S5}$ | $\Delta_{AVE}$ |
|---|---|---|---|---|---|---|
| LOT (A) | 11 | 10 | 11 | 11 | 11 | 11 |
| LOT (B) | 11 | 12 | 11 | 12 | 12 | 12 |
| LOT (C) | 10 | 10 | 11 | 11 | 11 | 11 |
| LOT (D) | 11 | 12 | 11 | 11 | 12 | 11 |
| LOT (E) | 16 | 14 | 13 | 15 | 16 | 15 |

When the criterion in non-defective determination was set to the evaluation-target contrast being within a range of ±10% relative to the standard contrast, only LOTs (A) to (D) were determined as non-defective, and LOT (E) did not correspond to non-defective.

Figure 3A:
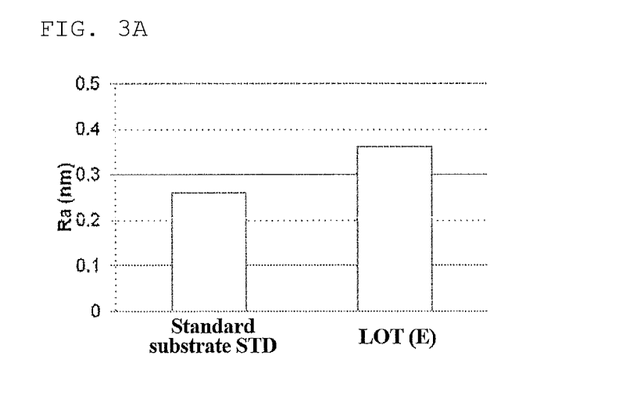
FIG. 3A is a graph showing results of AFM of the standard substrate STD and LOT (E) in Example 1, relating to Ra.
Figure 3B:
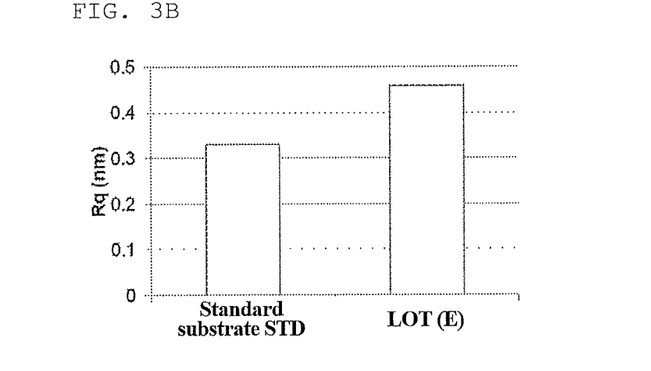
FIG. 3B is a graph showing results of AFM of the standard substrate STD and LOT (E) in Example 1, relating to Rq.

FIG. 3 show the results of AFM of the standard substrate STD and LOT (E). As an indicator of the surface roughness, the arithmetic mean of roughness Ra and the root-mean-square height Rq were measured. FIG. 3A shows the results of Ra, and FIG. 3B shows the results of Rq.

In each indicator, there was a significant difference of about 0.1 nm.

Figure 4A:
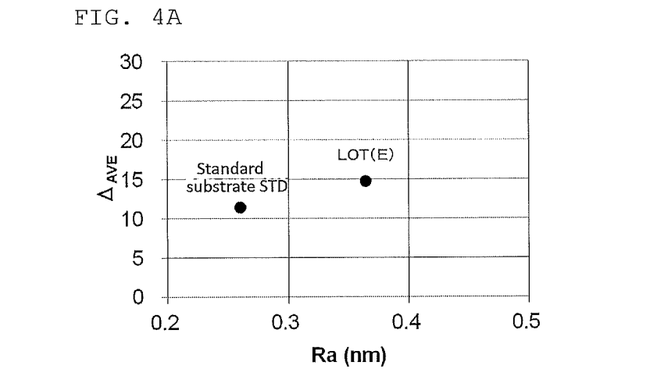
FIG. 4A is a graph comparing each $\Delta_{AVE}$ of the standard substrate STD and LOT (E) relative to each Ra in Example 1.
Figure 4B:
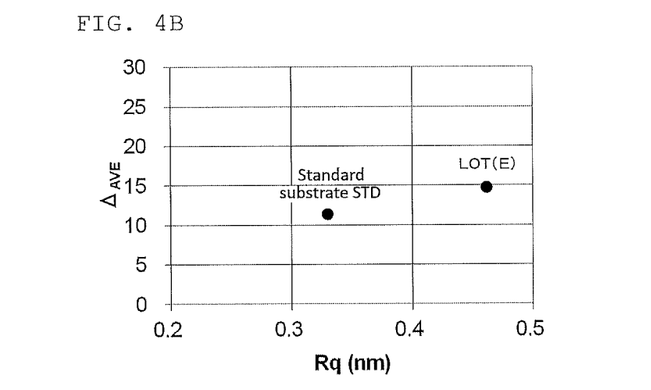
FIG. 4B is a graph comparing each $\Delta_{AVE}$ of the standard substrate STD and LOT (E) relative to each Rq in Example 1.

FIGS. 4A and 4B show the results of comparing each $\Delta_{AVE}$ of the standard substrate STD and LOT (E) relative to each Ra and Rq.

FIGS. 3 and 4 show that the standard substrate STD, with the standard contrast $\Delta_{AVE}$ being 11, had Ra and Rq of less than 0.3 nm and less than 0.4 nm respectively; on the other hand, LOT (E), with the evaluation-target contrast $\Delta_{AVE}$ being 15 (i.e., the evaluation-target contrast was more than the range of ±10% relative to that of the standard substrate STD), had Ra and Rq of more than 0.3 nm and more than 0.4 nm respectively.

Additionally, other LOTS (A) to (D) (each of which had a evaluation-target contrast being within the range of ±10% relative to that of the standard substrate STD) were measured in the same way to reveal that the Ra and Rq were less than 0.3 nm and less than 0.4 nm respectively as in the standard substrate STD.

LOT (E) can be determined to have a pseudo-defect in the step of inspecting defects, for example.

On the basis of the results of the standard substrate STD and LOT (E) in FIG. 4 as well as the results of LOTs (A) to (D) described above, it was found that the produced photomask blanks could be distinguished between normal ones and abnormal ones by setting the control threshold of the contrast to be within a range of ±10%. It was possible to determine LOTs (A) to (D) described above, having Ra and so on that were equal to those of the standard substrate STD, as non-defective and to eliminate LOT (E), in which Ra and so on were large.

Example 2

The inventive evaluation method was performed by the evaluation method using a contrast amplification factor.

In the first place, the non-defective images of the standard substrate STD and LOTs (A) to (E), which were the same as in Example 1, were acquired using M6640S at the corner parts of S1 (−65 mm, −65 mm), S2 (−65 mm, 65 mm), S3 (65 mm, −65 mm), and S4 (65 mm, 65 mm) as well as the central part S5 (0 mm, 0 mm). Each contrast was acquired from the surface image, and the contrast amplification factors $\gamma_{s1}$ to $\gamma_{s5}$ were abstracted (standard contrast amplification factor, evaluation-target contrast amplification factor).

Figure 5A:
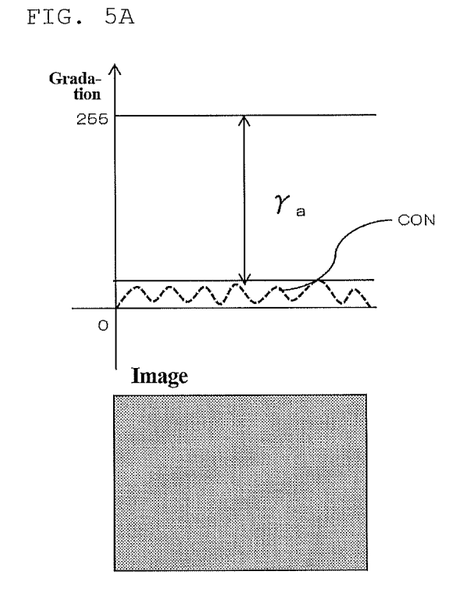
FIG. 5A is an explanatory drawing of an example showing relation between the contrast amplification factor and the surface conditions of a photomask blank film, in which $\gamma_a$ is a contrast amplification factor at the non-defective part.
Figure 5B:
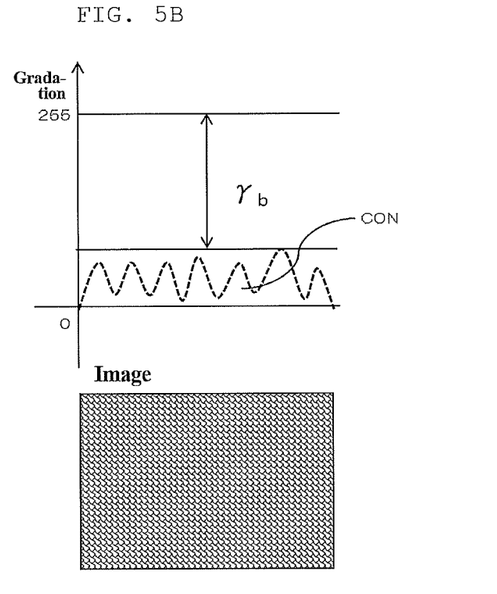
FIG. 5B is an explanatory drawing of an example showing relation between the contrast amplification factor and the surface conditions of a photomask blank film, in which $\gamma_b$ is a contrast amplification factor when the surface roughness is larger than the usual.

In the first place, the relation between the surface conditions and the contrast amplification factor will be described by example. FIG. 5 show the relation between the contrast amplification factor and the surface conditions of a photomask blank film. The contrast amplification factor is a magnification to enlarge the contrast of a surface image to a certain gradation. FIG. 5A shows the contrast amplification factor $\gamma_a$ at the non-defective part. In case of a non-defective image, the amplification factor reflects the contrast CON of the surface conditions of a film. FIG. 5B shows a case in which the surface roughness of a film is larger than the usual. When the surface roughness is larger than in the case of FIG. 5A, the contrast CON is emphasized even in a non-defective part, thereby making the contrast amplification factor $\gamma_b$ at the non-defective part smaller than $\gamma_a$.

The following Table 3 shows the contrast amplification factors $\gamma_{s1}$ to $\gamma_{s5}$ of the standard substrate.

On the basis of these results, the average contrast amplification factor was calculated such that $\gamma_{AVE}=22.4$.

TABLE 3

| Contrast amplification factor | $\gamma_{S1}$ | $\gamma_{S2}$ | $\gamma_{S3}$ | $\gamma_{S4}$ | $\gamma_{S5}$ | $\gamma_{AVE}$ |
|---|---|---|---|---|---|---|
| STD | 23.2 | 21.3 | 23.2 | 21.3 | 23.2 | 22.4 |

The following Table 4 shows the contrast amplification factors $\gamma_{E1}$ to $\gamma_{s5}$ and the average contrast amplification factor $\gamma_{AVE}$ in each of LOTs (A) to (E).

The $\gamma_{AVE}$ in each of LOTs (A) to (D) was varied within ±10% relative to the standard substrate, but the WAVE of LOT (E) was smaller than that of the standard substrate STD by 20% or more.

TABLE 4

| Contrast amplification factor | $\gamma_{S1}$ | $\gamma_{S2}$ | $\gamma_{S3}$ | $\gamma_{S4}$ | $\gamma_{S5}$ | $\gamma_{AVE}$ |
|---|---|---|---|---|---|---|
| LOT (A) | 23.2 | 25.5 | 23.2 | 24.3 | 23.2 | 23.9 |
| LOT (B) | 23.2 | 21.3 | 23.2 | 21.3 | 21.3 | 22.0 |
| LOT (C) | 25.5 | 25.5 | 23.2 | 23.2 | 23.2 | 24.1 |
| LOT (D) | 23.2 | 21.3 | 23.2 | 24.3 | 21.3 | 22.6 |
| LOT (E) | 15.9 | 18.2 | 19.6 | 17.0 | 15.9 | 17.3 |

When the criterion in non-defective determination was set to the evaluation-target contrast amplification factor being within a range of ±10% relative to the standard contrast amplification factor, only LOTs (A) to (D) were determined as non-defective, and LOT (E) did not correspond to non-defective.

Figure 6A:
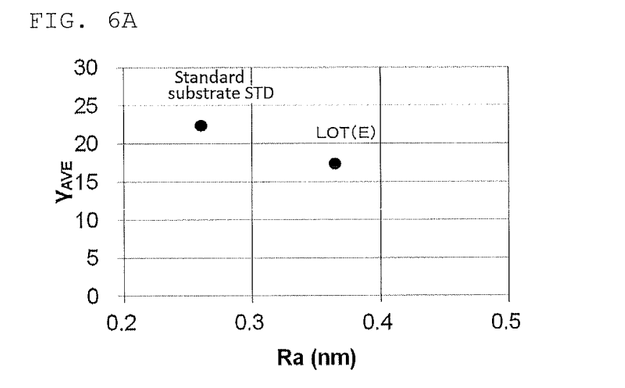
FIG. 6A is a graph comparing each $\gamma_{AVE}$ of the standard substrate STD and LOT (E) relative to each Ra in Example 2.
Figure 6B:
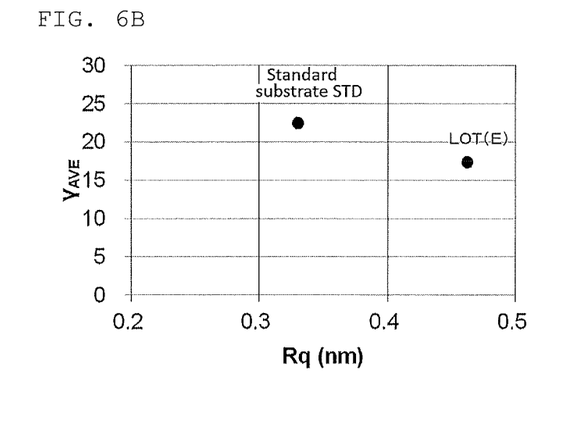
FIG. 6B is a graph comparing each $\gamma_{AVE}$ of the standard substrate STD and LOT (E) relative to each Rq in Example 2.

FIGS. 6A and 6B show the results of comparing each PAVE of the standard substrate STD and LOT (E) relative to the arithmetic mean of roughness Ra and the root-mean-square height Rq measured by AFM. Additionally, other LOTs (A) to (D) were measured in the same way.

As a result, LOTs (A) to (D), each of which had a evaluation-target contrast amplification factor being within the range of ±10% relative to the standard contrast amplification factor, showed the same Ra and Rq as those of the standard substrate STD, which were less than 0.3 nm and less than 0.4 nm respectively as in Example 1. On the other hand, LOT (E), with the contrast amplification factor being more than the range of ±10%, had Ra and Rq of more than 0.3 nm and more than 0.4 nm respectively.

As described above, it was found that the produced photomask blanks could be distinguished between normal ones and abnormal ones by setting the control threshold of the contrast amplification factor to be within a range of ±10%.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method of evaluating a photomask blank-associated substrate, the method comprising the steps of:
   taking an image of a surface of the photomask blank-associated substrate to acquire a surface image;
   acquiring a contrast of the surface image from the acquired surface image; and
   evaluating the photomask blank-associated substrate on the basis of the acquired contrast of the surface image, wherein the evaluation of the photomask blank-associated substrate comprises the steps of:
   acquiring a standard contrast previously, comprising:
      preparing a standard photomask blank-associated substrate, and acquiring a contrast of a surface image of the standard photomask blank-associated substrate as the standard contrast;
acquiring an evaluation-target contrast, comprising:
preparing an evaluation-target photomask blank-associated substrate other than the standard photomask blank-associated substrate, and
acquiring a contrast of a surface image of the evaluation-target photomask blank-associated substrate as the evaluation-target contrast using an optical system identical with that used in the step of acquiring the standard contrast; and
comparing contrasts to evaluate the evaluation-target photomask blank-associated substrate by comparing the evaluation-target contrast and the standard contrast.

2. The method of evaluating a photomask blank-associated substrate according to claim 1, wherein the evaluation-target photomask blank-associated substrate is evaluated as a non-defective when the evaluation-target contrast is within a range of a predetermined percentage relative to the standard contrast in the step of comparing contrasts.

3. The method of evaluating a photomask blank-associated substrate according to claim 2, wherein the evaluation-target photomask blank-associated substrate is evaluated as a non-defective when the evaluation-target contrast is within a range of ±10% relative to the standard contrast in the step of comparing contrasts.

4. The method of evaluating a photomask blank-associated substrate according to claim 3, wherein the image of the surface of the photomask blank-associated substrate is taken under a confocal optical system and a bright-field in acquiring the surface image.

5. The method of evaluating a photomask blank-associated substrate according to claim 2, wherein the image of the surface of the photomask blank-associated substrate is taken under a confocal optical system and a bright-field in acquiring the surface image.

6. The method of evaluating a photomask blank-associated substrate according to claim 1, wherein the evaluation-target photomask blank-associated substrate is evaluated as a non-defective when the evaluation-target contrast is within a range of ±10% relative to the standard contrast in the step of comparing contrasts.

7. The method of evaluating a photomask blank-associated substrate according to claim 6, wherein the image of the surface of the photomask blank-associated substrate is taken under a confocal optical system and a bright-field in acquiring the surface image.

8. The method of evaluating a photomask blank-associated substrate according to claim 1, wherein the image of the surface of the photomask blank-associated substrate is taken under a confocal optical system and a bright-field in acquiring the surface image.

9. A method of evaluating a photomask blank-associated substrate, the method comprising the steps of:
taking an image of a surface of the photomask blank-associated substrate to acquire a surface image;
acquiring a contrast of the surface image from the acquired surface image;
calculating a contrast amplification factor to set the acquired contrast of the surface image to a predetermined value; and
evaluating the photomask blank-associated substrate on the basis of the calculated contrast amplification factor, wherein the evaluation of the photomask blank-associated substrate comprises the steps of:
calculating a standard contrast amplification factor previously, comprising:
preparing a standard photomask blank-associated substrate, and
calculating a contrast amplification factor of a contrast of a surface image of the standard photomask blank-associated substrate as the standard contrast amplification factor;
calculating an evaluation-target contrast amplification factor, comprising:
preparing an evaluation-target photomask blank-associated substrate other than the standard photomask blank-associated substrate, and
calculating a contrast amplification factor of a contrast of a surface image of the evaluation-target photomask blank-associated substrate as the evaluation-target contrast amplification factor using an optical system identical with that used in the step of calculating the standard contrast amplification factor; and
comparing contrast amplification factors to evaluate the evaluation-target photomask blank-associated substrate by comparing the evaluation-target contrast amplification factor and the standard contrast amplification factor.

10. The method of evaluating a photomask blank-associated substrate according to claim 9, wherein the evaluation-target photomask blank-associated substrate is evaluated as a non-defective when the evaluation-target contrast amplification factor is within a range of a predetermined percentage relative to the standard contrast amplification factor in the step of comparing contrast amplification factors.

11. The method of evaluating a photomask blank-associated substrate according to claim 10, wherein the evaluation-target photomask blank-associated substrate is evaluated as a non-defective when the evaluation-target contrast amplification factor is within a range of ±10% relative to the standard contrast amplification factor in the step of comparing contrast amplification factors.

12. The method of evaluating a photomask blank-associated substrate according to claim 11, wherein the image of the surface of the photomask blank-associated substrate is taken under a confocal optical system and a bright-field in acquiring the surface image.

13. The method of evaluating a photomask blank-associated substrate according to claim 10, wherein the image of the surface of the photomask blank-associated substrate is taken under a confocal optical system and a bright-field in acquiring the surface image.

14. The method of evaluating a photomask blank-associated substrate according to claim 9, wherein the evaluation-target photomask blank-associated substrate is evaluated as a non-defective when the evaluation-target contrast amplification factor is within a range of ±10% relative to the standard contrast amplification factor in the step of comparing contrast amplification factors.

15. The method of evaluating a photomask blank-associated substrate according to claim 14, wherein the image of the surface of the photomask blank-associated substrate is taken under a confocal optical system and a bright-field in acquiring the surface image.

16. The method of evaluating a photomask blank-associated substrate according to claim 9, wherein the image of the surface of the photomask blank-associated substrate is taken under a confocal optical system and a bright-field in acquiring the surface image.

* * * * *